United States Patent [19]

Kasahara

[11] Patent Number: 5,152,054

[45] Date of Patent: Oct. 6, 1992

[54] METHOD OF MAKING FILM CARRIER STRUCTURE FOR INTEGRATED CIRCUIT TAPE AUTOMATED BONDING

[75] Inventor: Yoshihiko Kasahara, Suwa, Japan

[73] Assignee: Seiko Epson Corporation, Tokyo, Japan

[21] Appl. No.: 705,244

[22] Filed: May 24, 1991

[30] Foreign Application Priority Data

May 25, 1990 [JP] Japan .................. 2-136725
Jun. 22, 1990 [JP] Japan .................. 2-165332

[51] Int. Cl.[5] .......................... H01R 43/00
[52] U.S. Cl. ........................ 29/827; 174/52.4; 357/70
[58] Field of Search ............ 357/70; 174/52.4; 29/827; 428/901; 437/217, 220

[56] References Cited

U.S. PATENT DOCUMENTS

| 4,331,740 | 5/1982 | Burns | 357/70 X |
| 4,380,042 | 4/1983 | Angelucci et al. | 357/70 X |
| 4,806,409 | 2/1989 | Walter et al. | 357/70 X |
| 4,903,401 | 2/1990 | Webb | 174/52.4 X |
| 4,927,491 | 5/1990 | Masaki | 357/70 X |
| 5,028,614 | 4/1991 | Shreeve et al. | 357/70 X |
| 5,036,380 | 7/1991 | Chase | 357/70 |

*Primary Examiner*—Carl J. Arbes
*Attorney, Agent, or Firm*—Raymond J. Werner

[57] ABSTRACT

A structure and method are disclosed for tape automated bonding (TAB) assembly processes which provide for reduced manufacturing costs, greater film strength, and greater usable film area so that larger chips can be accommodated on a given size film. Common lines, which prevent the buildup of voltage differences between leads, are cut away before electrical testing by means of a knife that slices away the common line conductors parallel to the film surface rather than punching through the conductive leads attached to the common lines and underlying film. By eliminating the punch-outs more room is made available for large chips, film strength is not reduced because of multiple punch-outs, and manufacturing costs are reduced because product-specific punching tools are no longer required.

10 Claims, 4 Drawing Sheets

METHOD OF MAKING FILM CARRIER STRUCTURE FOR INTEGRATED CIRCUIT TAPE AUTOMATED BONDING

BACKGROUND OF THE INVENTION

The present invention relates generally to a tape automated bonding (TAB) process for assembly of integrated circuits. More particularly, this invention relates to a structure and method whereby larger chips can be accommodated on a given size film carrier, and manufacturing costs can be reduced through the elimination of die punches.

A conventional structure for TAB film carriers is shown in FIG. 6. The film carrier of FIG. 6 is comprised of a long insulating film 1, such as a polyimide tape, which has sprocket holes 6 and device holes 3 formed therein. Conductive leads having an inner lead section 4 and an outer lead section 5 are formed conventionally by creating patterns using photo-etching after laminating the film with a conductive metal foil, such as a copper foil. An integrated circuit chip 2 may be connected to inner lead section 4 which extends out into the device hole 3. Common lines 10 extending along each outer edge of film 1, typically inward of the sprocket holes, provide a means of shorting the leads together so that a voltage difference does not build up between any of the terminal pads on the chip.

However, as is readily understood by those of ordinary skill in this field, in order to electrically test a chip, each of its terminal pads must be separated from the common lines which short the terminal pads together.

In the prior art technology, the common lines are disconnected from the conductors by means of punching out sections of the film carrier that include portions of the conductors. Punch-outs 13 are shown in FIG. 6. The punch-out process requires tools such as a cutting die (punch die) for each product with a different arrangement of conductors on the film carrier. It takes time and money to fabricate these tools. Standardization of these tools is difficult because various products made with the TAB process have their own requirements for layout of the conductive patterns. Clearly, without some means of standardization, the cost associated with fabricating these tools is difficult to eliminate.

A further difficulty encountered in the use of the prior art technology is the limitation imposed on chip size by the punch-out process. The area on the film carrier required for punch-outs limits the area that can be used by integrated circuit chips. Elimination of punch-outs 13 would provide area on the film carrier for larger chips.

A still further difficulty encountered in the prior art technology is the reduction in film carrier strength due to punching out sections of the film carrier itself in order to disconnect the conductive leads from the shorting bars (i.e. common lines).

What is desirable is a structure for, and method of, TAB assembly which eliminates the cost of punching tools and the reduction of film carrier strength, while increasing the film carrier area available for chips so that larger chips can be accommodated on a fixed size film.

SUMMARY OF THE INVENTION

It is an object of the present invention to provide a TAB film carrier structure and method of assembly which obviates punch-outs on the sprocket sides of the film carrier and tools required to make those punch-outs.

Accordingly, the common lines on the sprocket sides of the film carrier are cut by a special knife, or blade, as the film passes through a cutting station. This cutting operation takes place in such a way that the leads and common lines are physically and electrically separated without cutting substantially through the underlying film. That is, some cutting of the surface of the film carrier may take place as long as the film's structural integrity remains intact. The blade engages the conductive material disposed on the film. The cutting takes place in close proximity to the film surface. A rotating saw may be used in place of a knife to cut the common lines without cutting substantially through the underlying film.

The method of the present invention is fully compatible with the conventional procedure of breaking the connection between the common lines and the leads just prior to electrical testing. This permits integrated circuit chips to be protected from static electicity as long as possible and thereby enhances production yields. The common lines are typically grounded during the assembly process.

An advantage of the present invention is the use of film carrier area, formerly dedicated to the required punch-outs, for test points.

Other objects and attainments, together with a fuller understanding of the present invention will become apparent and may be appreciated by referring to the following description and claims taken in conjunction with the accompanying drawings.

DETAILED DESCRIPTION OF THE INVENTION

Figure 1:
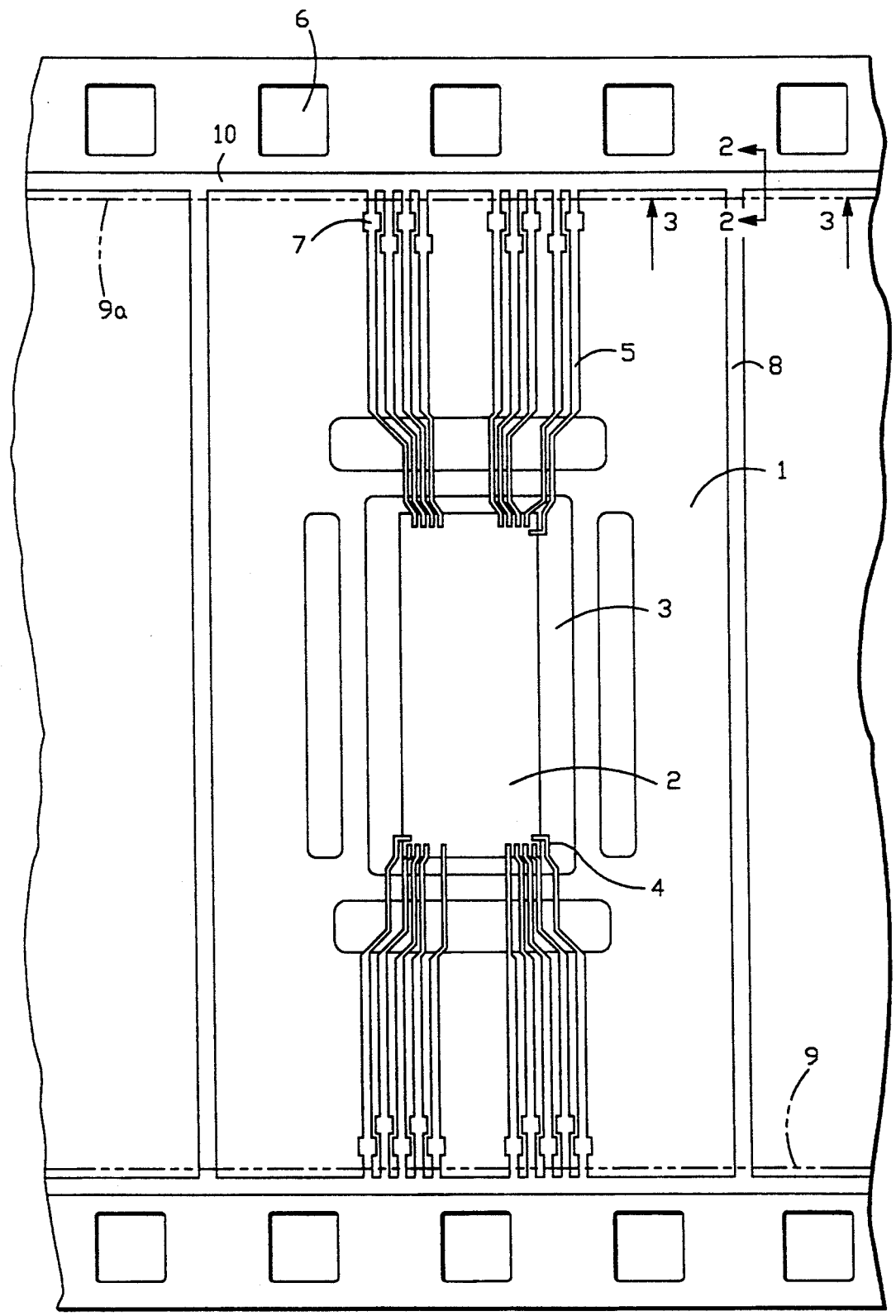
FIG. 1 is a top view of the film carrier structure of the present invention.

A system embodying the present invention is now described with reference to the drawings wherein like reference numerals refer to like parts throughout the drawings.

FIG. 1 shows a top view of the film carrier in one embodiment of the present invention. More particularly, FIG. 1 shows film carrier 1 made from an insulating material such as polyimide, chip 2 within device hole 3, inner lead section 4, outer lead section 5, sprocket holes 6, test points 7, transverse common lines 8 and common lines 10. Films thicknesses of approximately 50 microns, 75 microns, 125 microns and 150 microns are used for film carriers. The preferred thicknesses are approximately 75 microns and 125 microns.

Common lines 10, intersect with transverse common lines 8 at substantially right angles. In this manner they are physically and electrically interconnected. The typical thickness for the common line conductors is approximately 35 microns.

Figure 2:
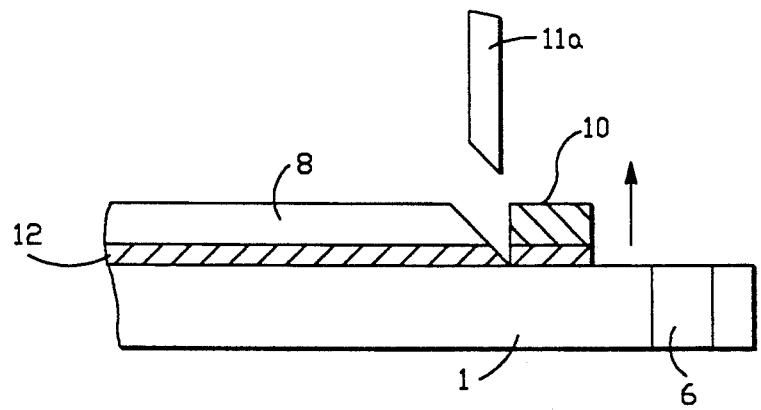
FIG. 2 is a cross section along line A—A in FIG. 1, which shows the cut which disconnects a common line from a transverse common line, where that cut is made by a knife blade.

FIG. 2 illustrates the interaction of cutting blade 11a with conductive common lines 10 and transverse common lines 8 by showing a cross section along line A—A in FIG. 1. The cut which severs electrical connection is seen to be made inwards of the sprocket hole 6 edge of film carrier 1 at a position indicated by 9a in FIG. 1. Common line 10, which passes through transverse common lines 8 and outer leads 5, will be cut through by cutting blade 11a, which is at cutting position 9a in FIG. 1. When the common lines are cut away from the conductive leads, those leads become electrically independent of each other and thus electrical testing may take place.

Figure 3:
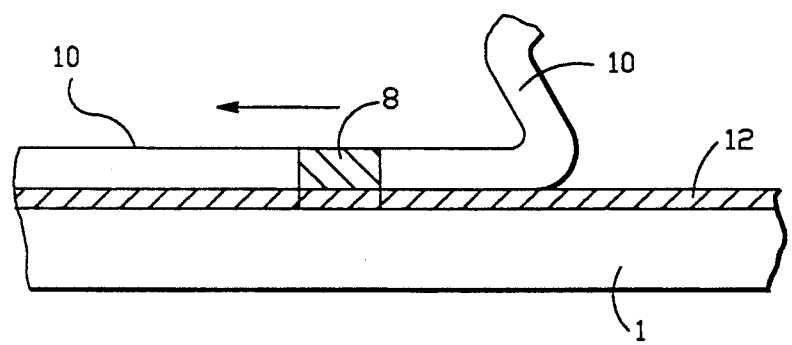
FIG. 3 is a cross section along line B—B in FIG. 1, which shows the common line after cutting.

FIG. 3 is a cross section of line B—B in FIG. 1 which shows the removal of common line 10 that has been cut as indicated in FIG. 2.

Since the present invention permits the leads to be disconnected from the common lines without punchouts, the area formerly consumed by the punch-outs can be advantageously used in other ways. One use, is the accommodation of larger chips by enlarging device hole 3 while maintaining leads having the same length as prior art leads. A second use, is utilization of the increased area made available through the method of the present invention to incorporate test points.

Test points 7, shown in FIG. 1, are regions along the length of outer leads 5 where the conductive material comprising outer leads 5 is made wider than the remaining portions of the outer leads. The wider regions, that is, test points 7, facilitate access to the chip 2 by test equipment. As shown in FIG. 1, test points 7 are interleaved thus permitting the largest test points possible within a given pitch. Inclusion of these test points allows test equipement to more easily access the electrical leads connected to the integrated circuit under test.

Figure 4:
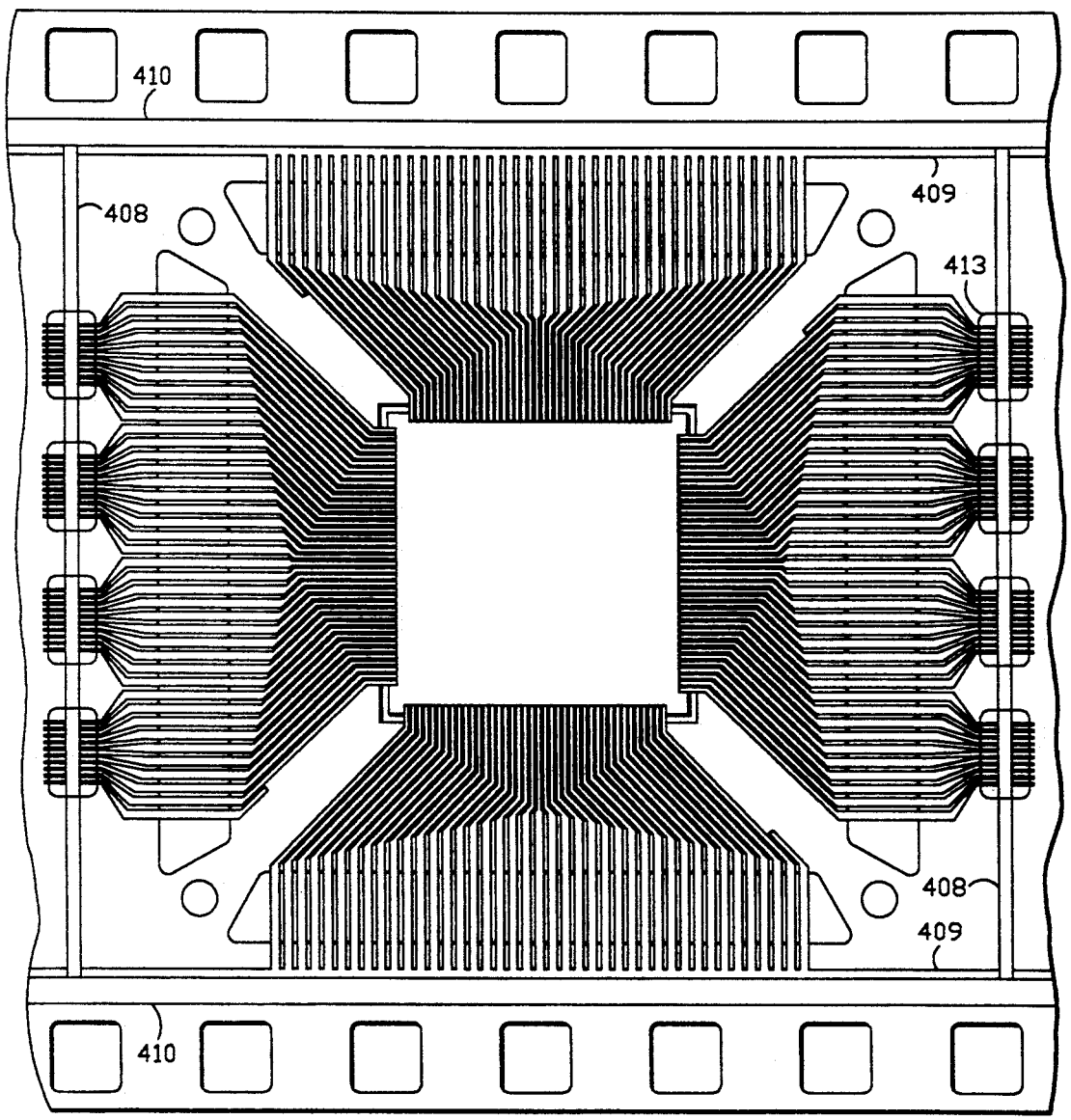
FIG. 4 shows a top view of another embodiment of this invention.
Figure 6:
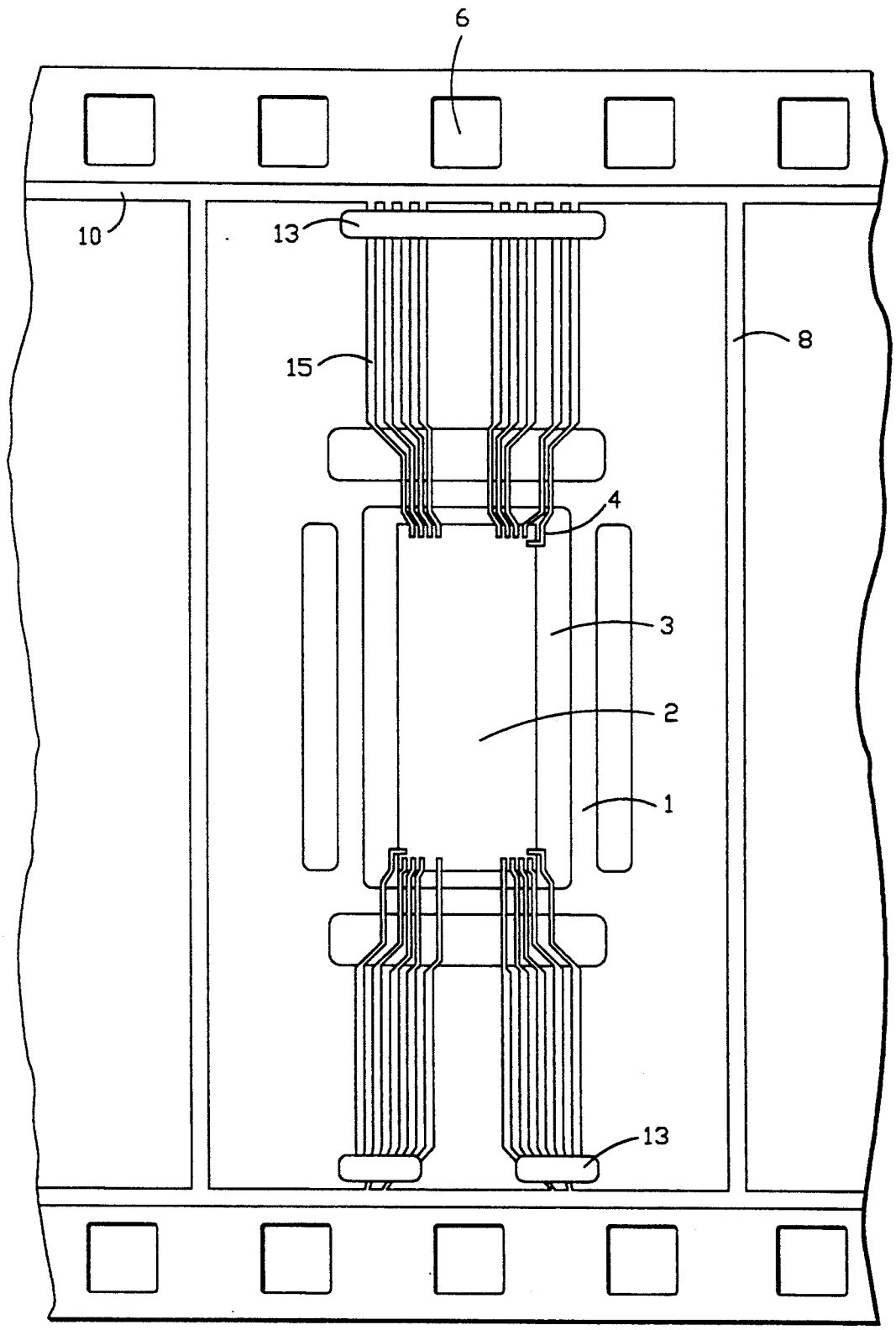
FIG. 6 is a top view of a prior art film carrier.

It is well known to those skilled in this field that leads such as those shown in FIGS. 1, and 6, may also spread out along the film carrier in a substantially lengthwise direction as shown in FIG. 4. When a large number of conductive leads are used, space does not permit every conductive lead to be laid out so that connection with a common line, parallel to the lengthwise direction of the film, is possible. Those leads which cannot be connected to the common lines just described, are connected to transverse common lines 408 as shown in FIG. 4. The connections to transverse common lines are cut with the conventional method of punching out holes 41.

Figure 5:
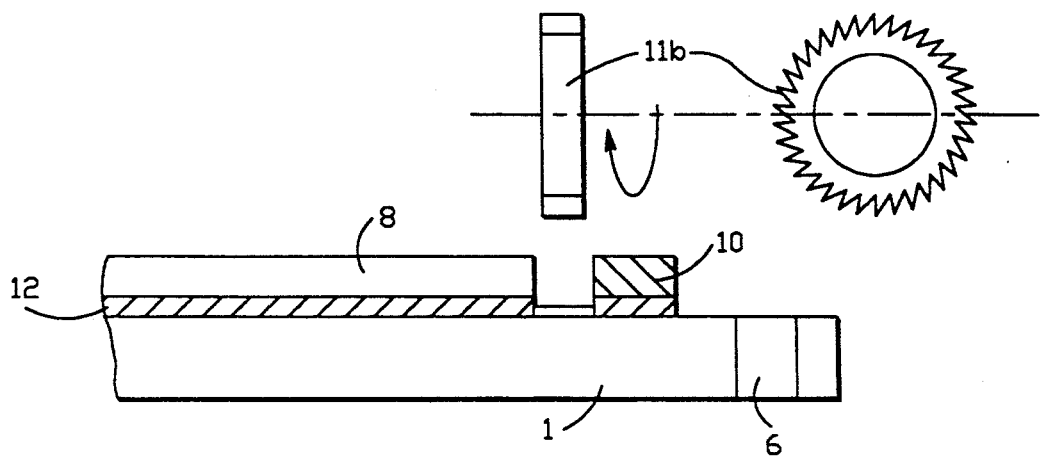
FIG. 5 is a cross section along line A—A in FIG. 1, which shows a cut which disconnects the common line from a transverse common line, where that cut is made by a rotary saw blade.

FIG. 5 is a cross section taken along line A—A in FIG. 1 which shows the cutting, or disconnection, of common line 10 from transverse common line 8.

There are two layer and three layer film carrier structures which are commonly used. Two layer structures comprise a conductive foil, typically a metal foil, disposed directly on a surface of an insulating film. Three layer structures comprise a nonconductive adhesive layer, typically 20 microns thick, disposed between an insulating film and a conductive foil. The method of the present invention may be used regardless of whether the common lines and conductive patterns are fabricated with either the two layer or three layer structure.

While the invention has been described in conjunction with specific embodiments, it is evident to those skilled in the art that many further alternatives, modifications and variations will be apparent in light of the foregoing description. The invention described herein is intended to embrace all such alternatives, modifications, applications and variations as may fall within the spirit and scope of the subjoined claims.

What is claimed is:

1. A method of producing an integrated circuit product via tape automated bonding, comprising the steps of:
   a) engaging a blade having two sides, with a conductive material disposed on the surface of a film carrier, to a depth such that said conductive material is fully engaged with said blade and said film carrier is not substantially engaged with said film carrier;
   b) moving said film carrier past said blade; and
   c) separating said conductive material into two portions, one portion being on each of said sides of said blade without effecting the transverse dimensions of said film carrier.

2. The method of claim 1, wherein said blade is a rotary saw blade.

3. The method of claim 1, wherein said conductive material comprises:
   a) common lines disposed on said film carrier and oriented substantially parallel to the lengthwise direction of said film carrier; and
   b) leads disposed on said film carrier and oriented substantially orthogonal to said common lines.

4. The method of claim 3, wherein said conductive material comprises transverse common lines.

5. A method of producing an integrated circuit product through a tape automated bonding process, comprising the steps of:
   a) engaging a blade haivng two sides, with a conductive material disposed on the surface of a film carrier, to a depth such that said conductive material is fully engaged with said blade and said film carrier is not substantially engaged with said film carrier;
   b) punching out sections of said film carrier upon which conductive material is disposed so as to disconnect at least one lead from a transverse common line;
   c) moving said film carrier past said blade; and
   d) separating said conductive material into two portions, one portion being on each of said sides of said blade without affecting the transverse dimensions of said film carrier.

6. The method of claim 5, wherein said conductive material comprises:
   a) common lines disposed on said film carrier and oriented substantially parallel to the lengthwise direction of said film carrier; and
   b) leads disposed on said film carrier and oriented substantially orthogonal to said common lines.

7. A method of producing an integrated circuit product by means of a tape automated bonding process, comprising the steps of:
   a) forming a plurality of outer leads having at least one test point incorporated in each of said outer leads;
   b) engaging a blade having two sides, with a conductive material disposed on the surface of a film carrier, to a depth such that said conductive material is fully engaged with said blade and said film carrier is not substantially engaged with said film carrier;
   c) moving said film carrier past said blade; and d) separating said conductive material into two portions, one portion being on each of said sides of said blade without affecting the transverse dimensions of said film carrier.

8. The method of claim 7, wherein said test point comprises a region of conductive material disposed intermediate the distal ends of said leads.

9. The method of claim 7, further comprising the step of punching out sections of said film carrier upon which conductive material is disposed so as to disconnect at least one lead from a transverse common line.

10. The method of claim 7, wherein said test points are interleaved.

* * * * *